(12) United States Patent
Lung

(10) Patent No.: US 6,864,503 B2
(45) Date of Patent: Mar. 8, 2005

(54) SPACER CHALCOGENIDE MEMORY METHOD AND DEVICE

(75) Inventor: Hsiang Lan Lung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 79 days.

(21) Appl. No.: 10/215,956

(22) Filed: Aug. 9, 2002

(65) Prior Publication Data

US 2004/0026686 A1 Feb. 12, 2004

(51) Int. Cl.[7] .................................................. H01L 39/00
(52) U.S. Cl. ........................ 257/30; 257/30; 257/31; 257/246
(58) Field of Search .............................. 257/3, 2, 4, 5, 257/395, 396, 392, 50; 365/163, 105; 237/396, 392, 50

(56) References Cited

U.S. PATENT DOCUMENTS

| | | | |
|---|---|---|---|
| 5,534,712 A | * | 7/1996 | Ovshinsky et al. ............ 257/3 |
| 5,687,112 A | | 11/1997 | Ovshinsky |
| 5,789,277 A | | 8/1998 | Zahorik et al. |
| 5,831,276 A | * | 11/1998 | Gonzalez et al. .............. 257/3 |
| 5,837,564 A | | 11/1998 | Sandhu et al. |
| 5,869,843 A | * | 2/1999 | Harshfield ..................... 257/5 |
| 5,879,955 A | | 3/1999 | Gonzalez et al. |
| 6,031,287 A | | 2/2000 | Harshfield |
| 6,087,674 A | * | 7/2000 | Ovshinsky et al. ............ 257/2 |
| 6,104,038 A | | 8/2000 | Gonzalez et al. |
| 6,111,264 A | | 8/2000 | Wolstenholme et al. |
| 6,147,395 A | | 11/2000 | Gilgen |
| 6,150,253 A | | 11/2000 | Doan et al. |
| 6,177,317 B1 | | 1/2001 | Huang et al. |
| 6,271,090 B1 | | 8/2001 | Huang et al. |
| 6,579,760 B1 | | 6/2003 | Lung |
| 2001/0055838 A1 | | 12/2001 | Walker et al. |
| 2002/0081833 A1 | | 6/2002 | Li et al. |

OTHER PUBLICATIONS

Guy Wicker et al. "Nonvolatile, High Density, High Performance Phase Change Memory" Ovonyx, Inc., Troy, MI; Mission Research Corp., Alburquerque, NM; Air Force Research Laboratory, Kirtland AFB, NM consisting of 8 pages, dated Oct. 23, 2001.

* cited by examiner

*Primary Examiner*—David Nelms
*Assistant Examiner*—Thinh T Nguyen
(74) *Attorney, Agent, or Firm*—Ernest J. Beffel, Jr.; Haynes Beffel & Wolfeld LLP

(57) ABSTRACT

The present invention includes devices and methods to form memory cell devices including a spacer comprising a programmable resistive material alloy. Particular aspects of the present invention are described in the claims, specification and drawings.

17 Claims, 2 Drawing Sheets

SPACER CHALCOGENIDE MEMORY METHOD AND DEVICE

BACKGROUND OF THE INVENTION

Chalcogenide materials are widely used in read-write optical disks. These materials have at least two solid phases, generally amorphous and generally crystalline. Laser pulses are used in read-write optical disks to switch between phases and to read the optical properties of the material after the phase change.

Chalcogenide materials also can be caused to change phase by application of electrical current. This property has generated interest in using programmable resistive material to form nonvolatile memory circuits.

One direction of development has been toward using small quantities of programmable resistive material, particularly in small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Accordingly, an opportunity arises to devise methods and structures that form memory cells with structures that use small quantities of programmable resistive material.

SUMMARY OF THE INVENTION

The present invention includes devices and methods to form memory cell devices including a spacer comprising a programmable resistive material alloy. Particular aspects of the present invention are described in the claims, specification and drawings.

DETAILED DESCRIPTION

Figure 1A:
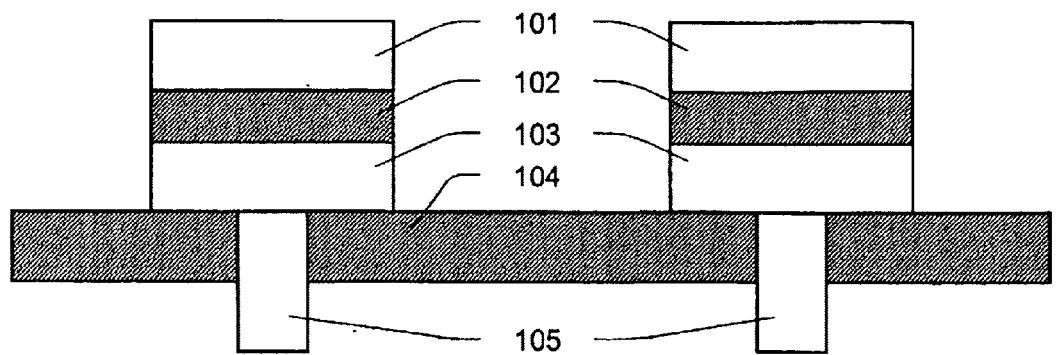
FIG. 1A is a block diagram of a multilayer structure.

The following detailed description is made with reference to the figures. Preferred embodiments are described to illustrate the present invention, not to limit its scope, which is defined by the claims. Those of ordinary skill in the art will recognize a variety of equivalent variations on the description that follows.

A chalcogenide alloy contains one or more elements from column six of the periodic table of elements. Many chalcogenide phase-change alloys have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. Ovshinsky '112 patent, cols 10–11. Particular alloys evaluated by another researcher include $Ge_2Sb_2Te_5$, $GeSb_2Te_4$ and $GeSb_4Te_7$. Noboru Yamada, "Potential of Ge—Sb—Te Phase-Change Optical Disks for High-Data-Rate Recording", *SPIE* v.3109, pp.28–37 (1997). More generally, a transition metal such as Cr, Fe, Ni, Nb, Pd, Pt and mixtures or alloys thereof may be combined with Ge/Sb/Te to form a phase-change alloy that has programmable resistive properties. Specific examples of memory materials that may be useful are given in Ovshinsky '112 cols. 11–13, which examples are hereby incorporated by reference.

Phase-change alloys are capable being switched between a first structural state in which the material is generally amorphous and a second structural state in which the material is generally crystalline in its local order. These alloys are at least bistable. The term amorphous is used to refer to a relatively less ordered structure, more disordered than a single crystal, which has the detectable characteristics such as high electrical resistivity. The term crystalline is used to refer to a relatively more ordered structure, more ordered in an amorphous structure, which has detectable characteristics such as lower electrical resistivity than the amorphous state. Typically, phase-change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase-change alloys can be changed from one phase state to another by application of electrical pulses. It has been observed that a shorter, higher amplitude pulse tends to change the phase-change material to a generally amorphous state. A longer, lower amplitude pulse tends to change the phase-change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase-change alloy. The physical phase-change process has motivated research into structures that use a small amount of programmable resistive material.

Figure 1B:
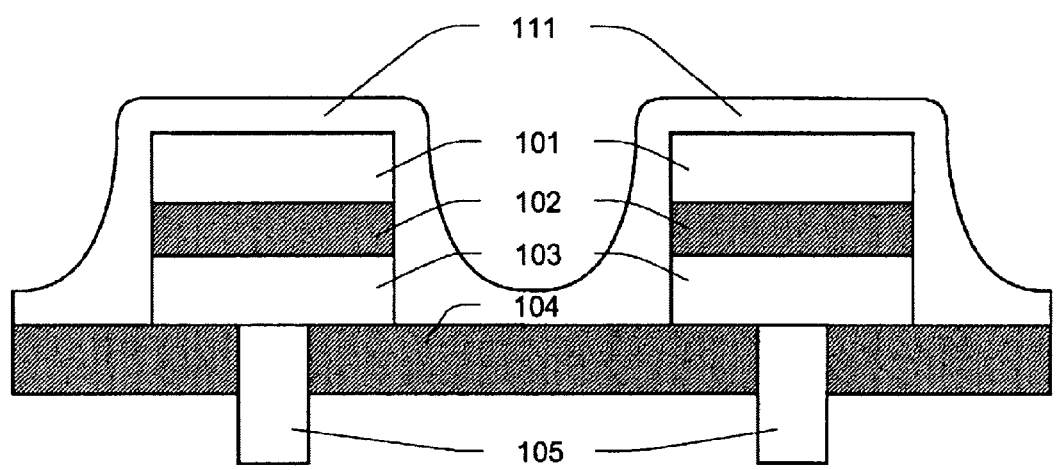
FIG. 1B is a block diagram of a multilayer structure with a deposited chalcogenide alloy layer.
Figure 1C:
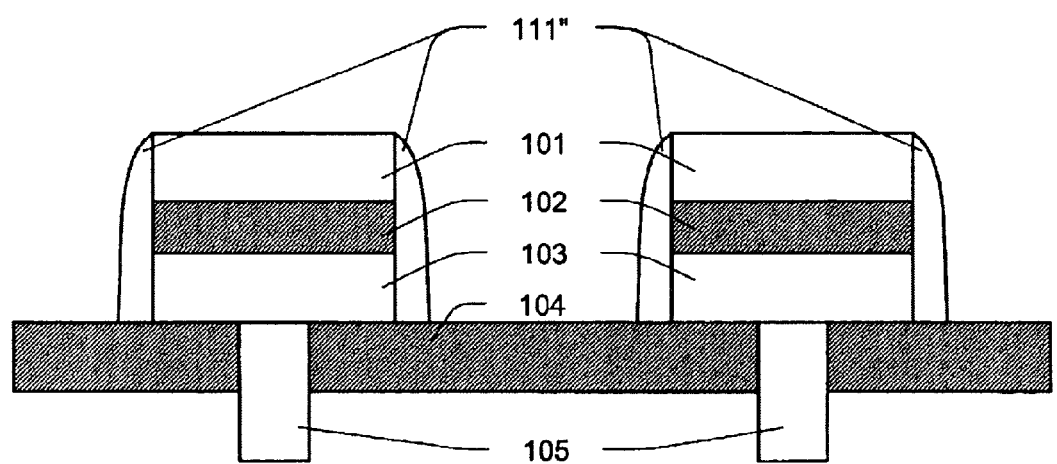
FIG. 1C is a block diagram of a multilayer structure with chalcogenide spacers.
Figure 2:
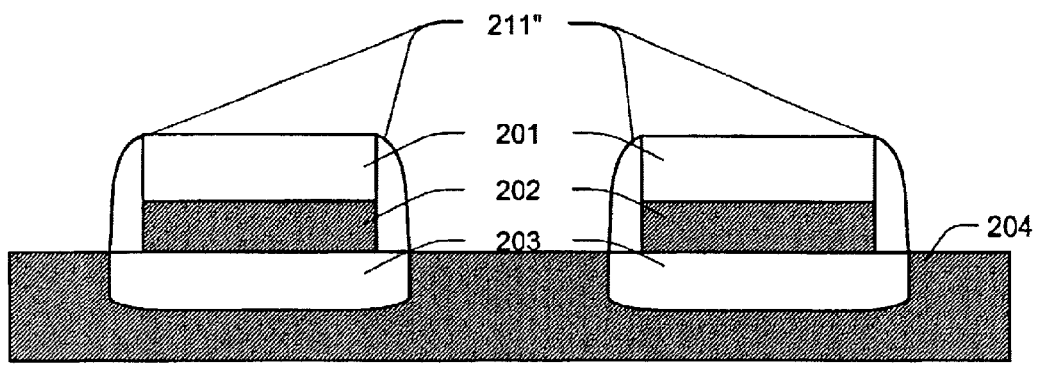
FIG. 2 is a block diagram of an alternate multilayer structure with chalcogenide spacers.

FIGS. 1C and 2 are block diagrams of novel cross-sections of programmable resistive material. FIG. 1 depicts a multilayer structure, having a first electrode 103, an insulating layer 102, over the first electrode, in the second electrode 101, over the insulating layer. The first electrode preferably is TiAlN. The first electrode preferably has a thickness of 10 to 30 nm, which is less than the minimum lithographic feature size of current lithographic processes.

The interelectrode insulating layer may be silicon oxide, silicon nitride, $Al_2O_3$ or an ONO or SONO multi-layer structure. Alternatively, the inter-electrode insulating layer may comprise one or more elements selected from the group consisting of Si, Ti, Al, Ta, N, O, and C. The inter-electrode thickness may be 100 to 300 nm. The second electrode may be TiW. It may have a thickness of 200 to 400 nm. Alterntively, the electrodes may be TiN or TaN, or may comprise one or more elements selected from the group consisting of Ti, W, Mo, Al, Ta, Cu, Pt, Ir, La, Ni, and O. A multilayer structure has sidewalls illustrated in FIG. 1 the right and left sides of the multilayer structure. The multilayer structures are constructed over a non-conductive or insulating base layer 104, which may be a substrate or a layer on top of other layers. In some embodiments, the contact via and plug 105 may be defined through the insulating layer 104 to make contact with the first electrode 103. The programmable resistive material in this structure forms a spacer 111" along the sidewalls of the multilayer structure. The spacer structure is formed using conventional methods of forming a spacer. Initial spacer deposition layer thickness may be 100 to 300 nm or less. After etching, the space width may be reduced to 10 to 20 nm, which is less than the minimum lithographic feature size of current lithographic processes. In this figure, the active region of phase change is preferably at the interface between the first electrode and spacer. A low first electrode thickness improves device performance by reducing the interface area in which phase change takes place. Alternatively, the current flow, electrode materials and thicknesses could be reversed and the phase change area could appear at the interface to the second electrode.

Useful characteristics of the programmable resistive material include the material having at least two solid phases that can be reversibly induced by electrical current. These at least two phases include an amorphous phase and a crystalline phase. However, in operation, the programmable resistive material may not be fully converted to either an amorphous or crystalline phase. Intermediate phases or mixtures of phases may have a detectable difference in material characteristics. The two solid phases should generally be bistable and have different electrical properties. The programmable resistive material may be a chalcogenide alloy. A chalcogenide alloy may include $Ge_2Sb_2Te_5$. Alternatively, it may be one of the other phase-change materials identified above.

FIG. 2 depicts an alternate multilayer structure, having a first electrode 203 formed as a buried diffusion in semiconductor base layer 204. The base layer may be a substrate or a layer over other layers. In this multilayer structure, the insulating layer 202, is over the first electrode, and the second electrode 201, is over the insulating layer. The programmable resistive material 211" forms a spacer along the sidewalls of the multilayer structure, generally corresponding to the sides of the insulating layer 202 and the second electrode 201. The interface between the spacer and the second electrode defines a phase change region, as a high resistance material is more easily used for a second electrode than for the buried diffusion. This figure illustrates a buried diffusion without need for contact via. In alternate embodiments, a contact via could connect the buried diffusion through the additional insulating layer to layers below.

Figure 3:
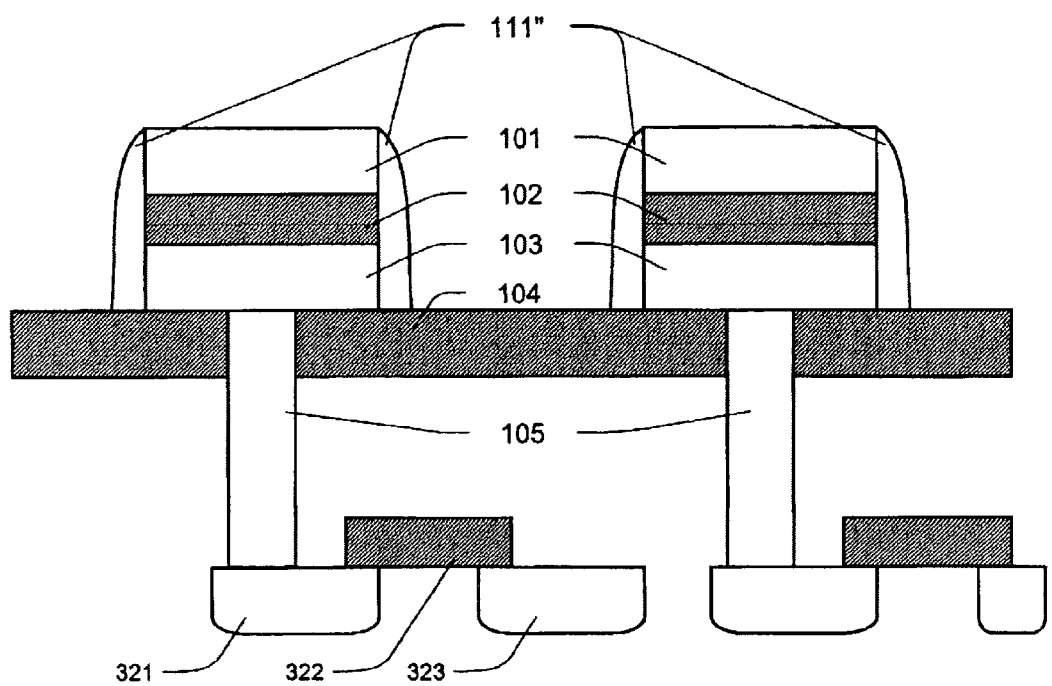
FIG. 3 is a block diagram of a multilayer structure with chalcogenide spacers and an additional isolation transistor.

FIG. 3 depicts an additional structure that may be combined with a spacer memory structure. In particular, an isolation transistor is illustrated. One pole 321 of the transistor is electrically connected to the contact 105. A gate 322 controls the flow of current from the other pole 323 to the contact. Use of an isolation transistor may be useful, as the electrical resistance of a programmable resistive material is unlikely ever to be so great as to block current leakage from the first electrode to the second electrode. Alternatively, an isolation junction or an isolation diode may be incorporated in the structure.

A conventional sequence for forming a spacer is generally illustrated in FIGS. 1A–1C. FIG. 1A illustrates a multilayer structure formed using conventional method. In FIG. 1B, a programmable resistive material 111 is the deposited over the multilayer structure. Techniques for depositing such a film include sputtering and chemical vapor deposition. A film deposited by such methods generally conforms to the structure presented, with some filling at low spots. An anisotropic etch is used to be moved most of the programmable resistive material, leaving spacers 111" along the sidewalls of the multilayer structure. The anisotropic etch may be a plasma etch, a reactive ion etch, or any other etch compatible with the materials used.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

We claim as follows:

1. A memory device, including:
    a multilayer structure, having a first electrode, an insulating layer over the first electrode and a second electrode over the insulating layer;
    wherein the multilayer structure defines a stack having sidewalls; and
    a programmable resistive material spacer along the sidewalls;
    wherein the programmable resistive material has at least two solid phases.

2. The device of claim 1, wherein the two solid phases are reversibly inducible by a current.

3. The device of claim 2, wherein the at least two solid phases include a generally amorphous phase and a generally crystalline phase.

4. The device of claim 1, wherein the programmable resistive material is a chalcogenide alloy.

5. The device of claim 4, wherein the chalcogenide alloy includes Ge2Sb2Te5.

6. The device of claim 4, wherein the chalcogenide alloy includes a combination of two or more materials from the group of Ge, Sb, Te, Se, In, Ti, Ga, Bi, Sn, Cu, Pd, Pb, Ag, S, or Au.

7. The device of claim 1, wherein the first electrode comprises an alloy of TiAlN and applying a current to an interface between the first electrode and the programmable resistive material spacer induces phase change at the interface.

8. The device of claim 7, wherein the first electrode has a thickness of 10 to 30 nm.

9. The device of claim 7, wherein the first electrode has a thickness loss than a minimum lithographic feature size of a lithographic process used to form the multilayer structure.

10. The device of claim 1, wherein the first electrode has a thickness of 10 to 30 nm and applying a current to an interface between the first electrode and the programmable resistive material spacer induces phase change at the interface.

11. The device of claim 1, wherein the first electrode has a thickness less than a minimum lithographic feature size of a lithographic process used to form the multilayer structure and applying a current to an interface between the first electrode and the programmable resistive material spacer induces phase change at the interface.

12. The device of claim 1, wherein the first electrode includes a doped region in a base layer, the base layer underlying the insulating layer, and the sidewall is defined by the base layer, the insulating layer and the second electrode.

13. The device of claim 12, wherein the second electrode comprises an alloy of TiAlN and applying a current to an interface between the second electrode and the programmable resistive material spacer induces phase change at the interface.

14. The device of claim 13, wherein the second electrode has a thickness of 10 to 30 nm.

15. The device of claim 13, wherein the second electrode has a thickness less than a minimum lithographic feature size of a lithographic process used to form the multilayer structure.

16. The device of claim 12, wherein the second electrode has a thickness of 10 to 30 nm and applying a current to an interface between the second electrode and the programmable resistive material spacer induces phase change at the interface.

17. The device of claim 12, wherein the second electrode has a thickness less than a minimum lithographic feature size of a lithographic process used to form the multilayer structure and applying a current to an interface between the second electrode and the programmable resistive material spacer induces phase change at the interface.

* * * * *